United States Patent
Kwon et al.

(10) Patent No.: US 6,979,875 B2
(45) Date of Patent: Dec. 27, 2005

(54) REDUCED SURFACE FIELD TECHNIQUE FOR SEMICONDUCTOR DEVICES

(75) Inventors: Tae-hun Kwon, Seoul (KR); Choel-joong Kim, Kyungki-do (KR); Suk-kyun Lee, Kyungki-do (KR)

(73) Assignee: Fairchild Korea Semiconductor Ltd., Bucheon (KR)

(*) Notice: Subject to any disclaimer, the term of this patent is extended or adjusted under 35 U.S.C. 154(b) by 0 days.

(21) Appl. No.: 10/447,558

(22) Filed: May 28, 2003

(65) Prior Publication Data

US 2004/0238913 A1    Dec. 2, 2004

(30) Foreign Application Priority Data

May 9, 2002 (KR) ............................. 2002-25623

(51) Int. Cl.[7] ............................................ H01L 23/58
(52) U.S. Cl. ................................. 257/492; 257/493
(58) Field of Search .............................. 257/492, 493

(56) References Cited

U.S. PATENT DOCUMENTS

| | | | |
|---|---|---|---|
| 5,306,652 A | 4/1994 | Kwon et al. ................ 437/40 |
| 5,382,535 A | 1/1995 | Malhi et al. ................ 437/40 |
| 5,498,554 A | 3/1996 | Mei ............................ 437/34 |
| 5,501,994 A | 3/1996 | Mei ............................ 437/40 |
| 5,512,495 A | 4/1996 | Mei et al. ................... 437/28 |
| 5,585,660 A | 12/1996 | Mei ........................... 257/389 |
| 5,739,061 A * | 4/1998 | Kitamura et al. .......... 438/275 |
| 5,801,420 A * | 9/1998 | Fujishima ................... 257/343 |
| 5,852,314 A | 12/1998 | Depetro et al. ............. 257/343 |
| 6,211,552 B1 | 4/2001 | Efland et al. ............... 257/343 |
| 6,242,787 B1 * | 6/2001 | Nakayama et al. ......... 257/493 |
| 6,693,339 B1 * | 2/2004 | Khemka et al. ............ 257/492 |
| 6,888,210 B2 * | 5/2005 | Jeon et al. .................. 257/492 |

OTHER PUBLICATIONS

Kwon, T.H., et al., "Newly designed isolated RESURF LDMOS transistor BCD process provides 20 V vertical NPN transistor", Jun. 24-6, 2002, 2002 60th DRC, pp. 67-68.*

Kim, M.H., et al., "A 650V rated RESURF-type LDMOS Employing an Internal Clamping Diode for Induced Bulk Breakdown withot EPI Layer", Jun. 4-7, 2001, Power Semiconductor Devices and ICs, 13th Internal Symposium, pp. 347-350.*

(Continued)

*Primary Examiner*—Howard Weiss
(74) *Attorney, Agent, or Firm*—Sidley Austin Brown & Wood LLP

(57) ABSTRACT

A power device and a method for manufacturing the same are provided. The power device comprises a first conductive semiconductor substrate; a second conductive buried layer formed to a certain depth within the semiconductor substrate; a second conductive epitaxial layer formed on the conductive buried layer; a first conductive well formed within the conductive epitaxial layer; a second conductive well formed within the second conductive epitaxial layer, on both sides of the first conductive well; a second conductive drift region formed in predetermined portions on the first and the second conductive well; and a lateral double diffused MOS transistor formed in the second conductive drift region. The breakdown voltage of the power device is controlled according to a distance between the first conductive well and the second conductive buried layer.

9 Claims, 7 Drawing Sheets

OTHER PUBLICATIONS

"Silicon Carbide Lateral Power MOSFETs," Jan Spitz, M.R. Melloch and J.A. Cooper, Jr., from website address http://www.ecn.purdue.edu/WBG/Device_Research/LDMOSFETs/Index.html, 3 pages.

"Design of a Lateral MOSFET in Silicon Carbide," Chris Sanders, Janna Bonds, Elmer Durrell, and Wendy Evans, Design document submitted to Professor Joseph Picone, Department of Electrical and Computer Engineering, Mississippi State University, Mar. 21, 2000, pp. 1-43.

"Linearly Graded Doping Drift Region: A Novel Lateral Voltage-sustaining Layer Used for Improvement of RESURF LDMOS Transistor Performances," Jin He[1,2], Xuemei Xi[2], Mansun Chan[2], Chenming Hu[2], Yingxue Li[1], Zhang Xing[1] and Ru Huang[1], *Semiconductor Science and Technology*, vol. 17, 2002, pp.

"The Insulated Gate Bipolar Transistor (IGBT)," from website address http://www.elec.gla.ac.uk/groups/dev_mod/papers/igbt/igbt.html, 3 pages.

* cited by examiner

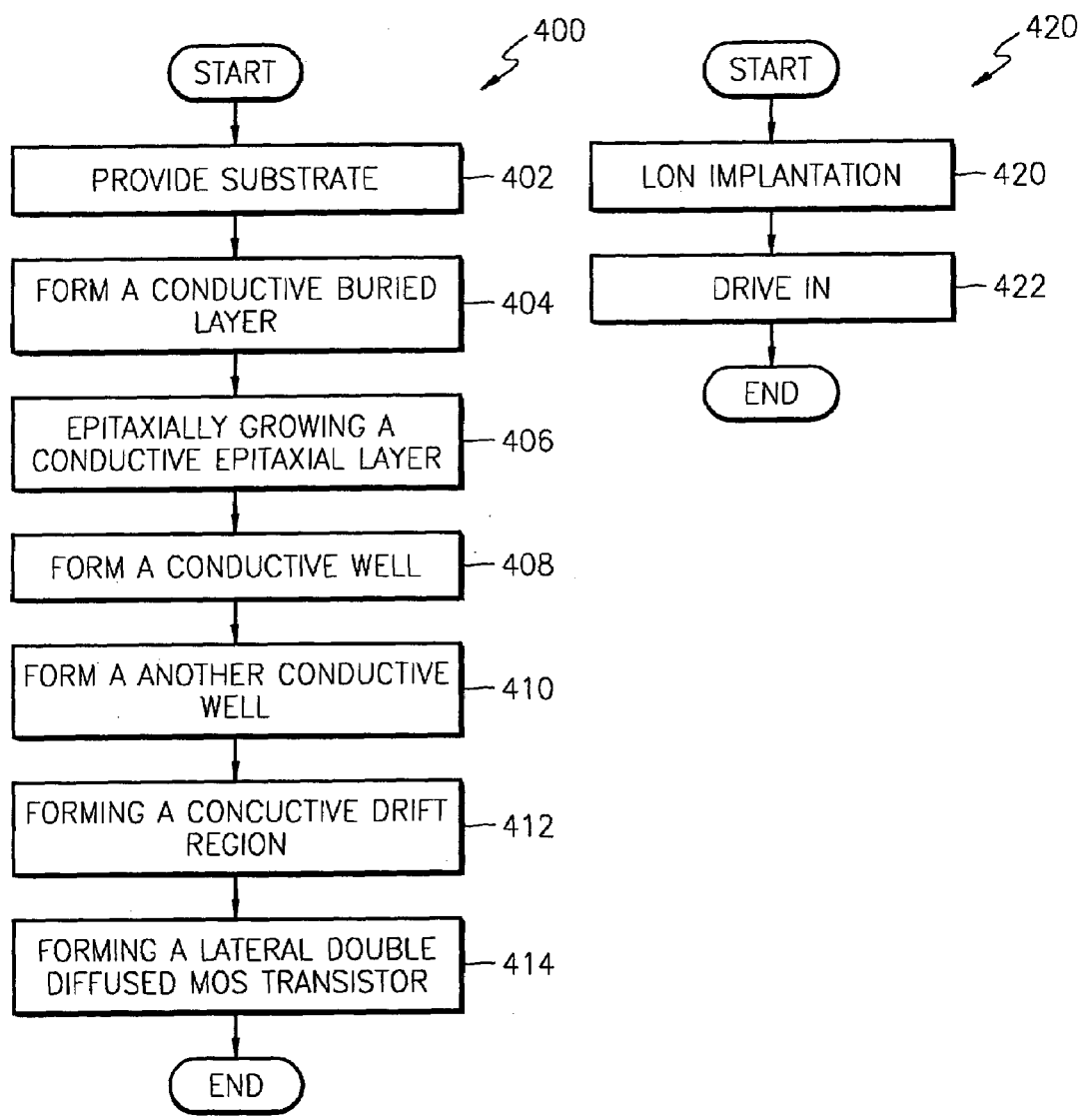

REDUCED SURFACE FIELD TECHNIQUE FOR SEMICONDUCTOR DEVICES

RELATED APPLICATION

This application claims priority to Korean Patent Application No. 2002-25623, entitled, "POWER DEVICE AND METHOD FOR MANUFACTURING THE SAME" filed on May 9, 2002.

FIELD OF THE INVENTION

The present invention relates generally to MOS (metal-oxide semiconductor) ICs (integrated circuits), and more particularly, to ICs comprising a LDMOS (lateral double-diffused MOS) device capable of having a high breakdown voltage and a method for manufacturing such a device.

BACKGROUND OF THE INVENTION

For some applications of semiconductor IC devices, it is desirable for the IC devices to operate at relatively high voltages, for example, in a range of 15–80 volts. LDMOS devices have been widely used as devices for control, logic and especially power switching. LDMOS devices may have a relatively high breakdown voltage so as to insulate high voltages. In addition, LDMOS devices may preferably have a low "ON" state resistance so as to provide good switching characteristics approaching those of an ideal switch.

In previously developed and deployed ICs, a power device may implement structures having an isolated RESURF (reduced surface field), so as to reduce electric fields at the substrate surface in pursuit of high breakdown voltage and low on-resistance. Isolated RESURF techniques may provide good electrical isolation between source and substrate which permits the use of LDMOS devices in high-side driver applications, especially since the Source is not coupled to ground.

FIG. 1 is a cross-sectional diagram of a semiconductor device, formed according to previously developed techniques for isolated RESURF.

As shown in FIG. 1, a $N^+$ buried layer 12 is formed on a P-substrate 10, and a $P^-$ epitaxial layer 14 with a particular thickness is formed on the $N^+$ buried layer 12. An N-well 18 is formed on the $P^-$ epitaxial layer 14 region.

A gate 24 and gate insulating layers 20, 22 are formed on an N-well 18 region. The gate insulating layers 20, 22 may include a thick-film gate oxide layer 20 and a thin-film gate oxide layer 22. A P-body region 26 is shown formed on the $P^-$ epitaxial layer 14 to the side of gate 24, and a source region 28a and a $P^+$ junction region 30 are formed on the P-body region 26. A drain region 28b is formed on the N-well 18 on the opposite side of the gate 24.

The gate 24 may be connected to a gate electrode (G), the source region 28a and the $P^+$ junction region 30 may be connected to a source electrode (S), and the drain region 28b may be connected to a drain electrode (D).

Still referring to FIG. 1, in the previously developed isolated RESURF technique, if an inverse bias is applied to the LDMOS device through the drain electrode, a depletion region begins to extend at the P-N junction interface between the N-well 18 and the $P^-$ epitaxial layer 14, in a vertical direction. When the extension of the depletion region passes a limit, a breakdown will occur in the LDMOS device. In this LDMOS device, the $P^-$ epitaxial layer 14 and N-well 18 are used as an isolated RESURF structure to provide the desired electrical isolation. Breakdown typically occurs between the $P^-$ epitaxial layer 14 and the N-well 18, and the breakdown voltage is substantially in direct proportion to the thickness of the $P^-$ epitaxial layer 14. Accordingly, the $P^-$ epitaxial layer 14 may be grown to considerable thickness so as to achieve a high breakdown voltage.

Whenever it is desired to manufacture a single device comprising transistors of various types of devices (e.g., bipolar transistor, CMOS (complementary MOS), and DMOS (double-diffused MOS)), such as a BCD (bipolar-CMOS-DMOS) device, a conflict may arise. For if the thickness of the epitaxial layer is increased to achieve a higher breakdown voltage for the DMOS it then becomes increasingly difficult to achieve desirable characteristics in the device of other types such as bipolar transistor and CMOS.

Alternatively, if the various desirable thickness of epitaxial layers desirable for each type of device are implemented, then the process for manufacturing power devices becomes excessively complex due to an excessive number of steps required in the process of forming the device. Furthermore, increasing manufacturing process complexity drives up costs.

In previously developed devices a further compromise may be necessary in that—it may be necessary to increase the doping concentration of the N-well 18 so as to obtain a low "ON" resistance of the power device. As the doping concentration of the N-well 18 is increased, the depletion region tends to extend at a faster rate, and a relative decrease in the breakdown voltage occurs, thus giving incentive to using a still thicker epitaxial layer.

SUMMARY OF THE INVENTION

According to an aspect of the invention, a power device may be provided. The power device may comprise a semiconductor substrate, a conductive buried layer formed within it, a conductive epitaxial layer formed thereon. A first conductive well may be formed within the conductive epitaxial layer and a second conductive well may be formed within the conductive epitaxial layer, on at least two sides of the first conductive well. A conductive drift region may be formed in predetermined portions on the first and the second conductive wells and a lateral double diffused MOS transistor may be formed in the conductive drift region.

According to a further aspect of the invention, a method for manufacturing a power device is provided. The method may comprise forming a conductive buried layer within a semiconductor substrate, epitaxially growing a conductive epitaxial layer on the second buried layer, forming a second conductive well in a predetermined region within the conductive epitaxial layer, forming a first conductive well in the conductive epitaxial layer beside the second conductive well forming a conductive drift region in an upper region of the first and the second conductive wells, and forming a lateral double diffused MOS transistor in the conductive drift region.

BRIEF DESCRIPTION OF THE DRAWINGS

FIGS. 4A–4C are flow diagrams for methods for manufacturing semiconductor devices, according to embodiments of the present invention.

DETAILED DESCRIPTION OF THE EMBODIMENTS

Figure 1:
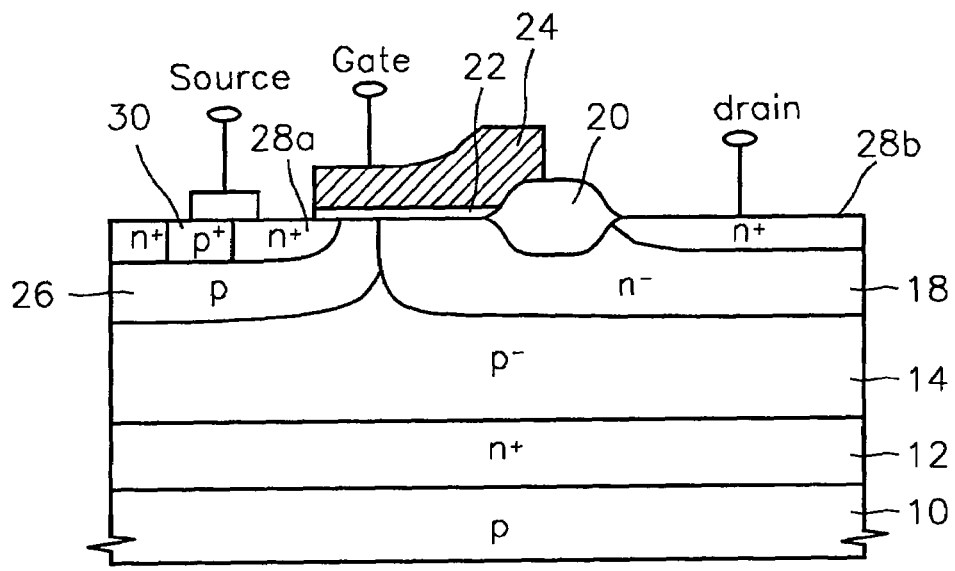
FIG. 1 is a cross-sectional diagram of a prior art semiconductor device.

Accordingly, it is necessary to develop a power device having a breakdown voltage not related to the thickness of an epitaxial layer.

The present invention is described below with reference to the accompanying drawings, in which a preferred embodiment of the invention is shown. This invention may, however, be embodied in many different forms, and should not be construed as being limited to the embodiment set forth herein; rather, this embodiment is provided so that this disclosure will be thorough and complete and will fully convey the concept of the present invention to those skilled in the art. In the drawings, the thickness of layers and regions may be exaggerated for clarity. Like reference numerals in different drawings refer to like and corresponding parts and their description may be omitted. It will also be understood that when a layer is referred to as being "on" another layer or a substrate, it can be directly on the other layer or the substrate, or intervening layers may be present.

Figure 2:
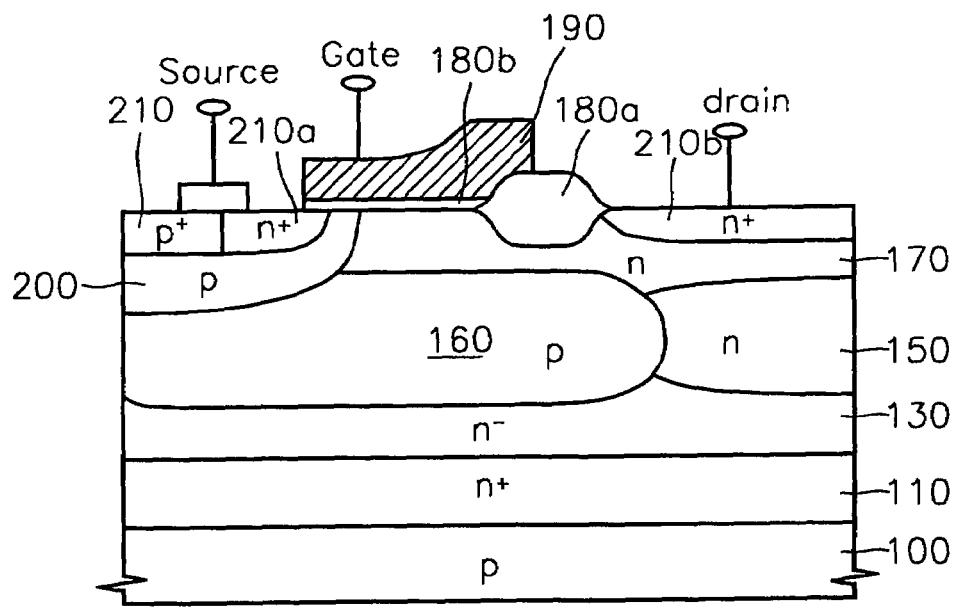
FIG. 2 is a cross-sectional diagram of part of a semiconductor device, according to an embodiment of the present invention.

FIG. 2 is a cross-sectional diagram of part of a semiconductor device, according to an embodiment of the present invention. Referring to FIG. 2, a $N^+$ buried layer 110 is formed deep inside a $P^{31}$ semiconductor substrate 100. The semiconductor substrate 100 includes $P^-$ dopants, e.g., B (Boron) ions, and the $N^+$ buried layer 110 formed in the semiconductor substrate 100 with a predetermined thickness. An $N^-$ epitaxial layer 130 is grown on the $N^+$ buried layer 110 to another predetermined thickness. Here, the $N^-$ epitaxial layer 130 may be formed on all the device regions including, for example, on a bipolar transistor region (not shown), on a CMOS transistor region (also not shown), and on the DMOS transistor region shown in FIG. 2. An N-well 150 and a P-well 160 are formed in the existing $N^-$ epitaxial layer region 130. The bottom surfaces of the N-well 150 and the P-well 160 may be formed to contact the $N^+$ buried layer 110 or may be formed separated from the $N^+$ buried layer 110 by a predetermined distance (such as may be created by epitaxial layer region 130). Here, the distance between the bottom surfaces of the N-well 150 and the P-well 160, and the top of the $N^+$ buried layer 110 largely controls the breakdown voltage. The N-well 150 may be formed closer to the $N^+$ buried layer 110. An N-drift region 170 may be formed in the merged upper portions of the N-well 150 and the P-well 160. The N-drift region 170 occupies a particularly controlled distance from the surface of the substrate 100 and may be formed, for example, by ion implantation using a channel stop ion region (not shown) in a CMOS device.

A thick-film gate oxide layer 180a and a thin-film gate oxide layer 180b may be formed on the existing N-drift region 170. The thick-film gate oxide layer 180a and the thin-film gate oxide layer 180b contact each other and the thick-film gate oxide layer 180a can be a LOCOS (Localized Oxidation of Silicon) oxide layer. A gate 190 may be formed on existing portions of the thick-film gate oxide layer 180a and the thin-film gate oxide layer 180b, and the gate 190 can be, for example, a doped polycrystalline layer. A $P^-$ body region 200 may be formed in the N-drift region 170 at one side of the gate 190 to prepare a region to be formed as a source region. An $N^+$ source region 210a and a $P^+$ contact region 220 may be formed within the $P^-$ body region 200. The bottom surface of the $P^-$ body region 200 may be extended into the P-well 160 as shown, and the $P^+$ contact region 220 may typically be located within and surrounded by the $N^+$ source region 210a.

An $N^+$ drain region 210b may be formed on the N-drift region 170 at the other side of the gate and the thick-film gate oxide layer 180b. In addition, the gate 190 may typically be electrically connected to the gate electrode (G). Similarly, the source region 210a and the P-contact region 220 may typically be electrically connected to the source electrode, and the drain region 210b may typically be electrically connected to the drain electrode (D).

Still referring to FIG. 2, an isolation region (not shown) may be positioned at a side of the N-type well 150 comprised of regions for high-concentration P dopants. In addition, where an inverse bias is applied to the drain electrode, concentrations of the P-well 160, the $N^-$ epitaxial layer 130, the $N^+$ buried layer 120 and the N-drift region 170 may be used so that breakdown occurs at the P-N interface between the P-well 160 and the $N^-$ epitaxial layer 130 first. In the LDMOS of this embodiment, $N^-$ epitaxial layer 130, N-well 150, and P-well 160 together form an isolated RESURF structure.

A method for manufacturing the power device is described below with reference to FIGS. 3A–3D which are cross-sectional diagrams illustrating the layers of a semiconductor device during sequential exemplary processing steps according to an embodiment of the present invention.

FIGS. 3A–3D depict a semiconductor substrate that may, for example, be a Silicon substrate having P type impurities. Other substrates are possible within the general scope of the invention. For example, the substrate 100 may comprise Si (Silicon), GaAs (Gallium Arsenide), or any other suitable semiconductor material, which may be doped with suitable dopants.

Figure 3A:
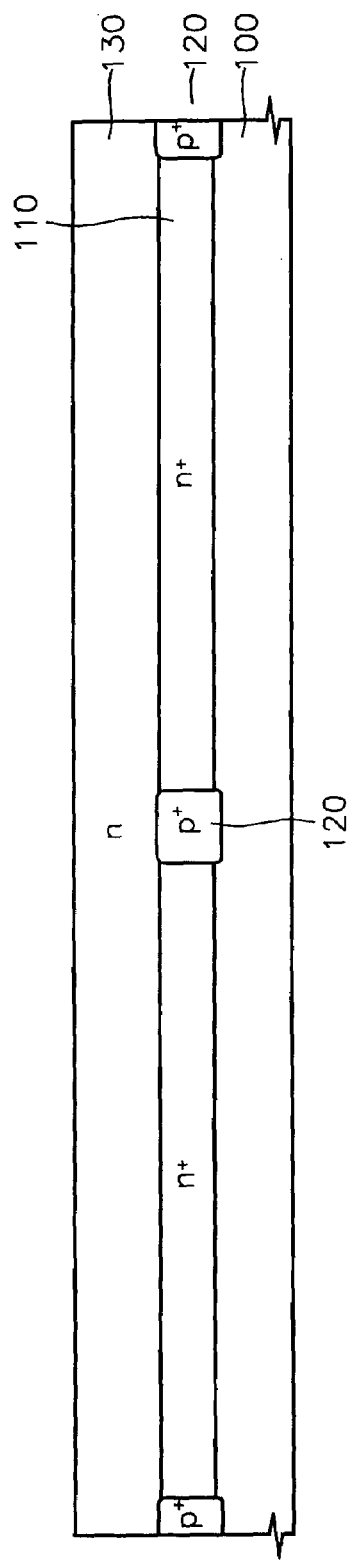
FIGS. 3A–3D are cross-sectional diagrams illustrating the layers of a semiconductor device during sequential exemplary processing steps, according to an embodiment of the present invention.

Referring to FIG. 3A, a semiconductor substrate 100 is prepared. A mask pattern (not shown) for forming an $N^+$ buried layer 110 on the semiconductor substrate 100 may formed, for example, using a well-known photolithography process. By implanting $N^+$ dopants in the exposed semiconductor substrate 100, a $N^+$ buried layer 110 may be formed by activating the implanted $N^+$ dopants with a drive-in process. Next comes removing the mask pattern for defining the $N^+$ buried layer with plasma ashing, a well-known technique.

Then a mask pattern (not shown) for a $P^+$ underlayer may be formed to expose the space between $N^+$ buried layers 110. A $P^+$ underlayer 120 may then be formed by implanting $P^+$ dopants into the exposed semiconductor substrate 100 and subsequently performing another drive-in process. Next, the mask pattern for forming $P^+$ underlayer 120 is removed. $P^+$ underlayers 120 may formed in the substrate 100 to provide isolation between the various $N^+$ buried layers 110.

Referring again to FIG. 3A, an $N^-$ epitaxial layer 130 may then be formed by epitaxial growth on the semiconductor substrate 100, on which the $N^+$ buried layer 110 and the $P^+$ underlayer 120 are formed. Since an $N^+$ buried layer 110 is formed on most of the semiconductor substrate 100, the grown epitaxial layer 130 may be of $N^-$ (low-concentration N-type). It is possible, for example, to make the epitaxial layer 130 have low-concentration N-type by means of an additional doping process. The $N^-$ epitaxial layer 130 may typically be grown to have a uniform thickness throughout the entire region. This completes a second stage in the processing.

Figure 3B:
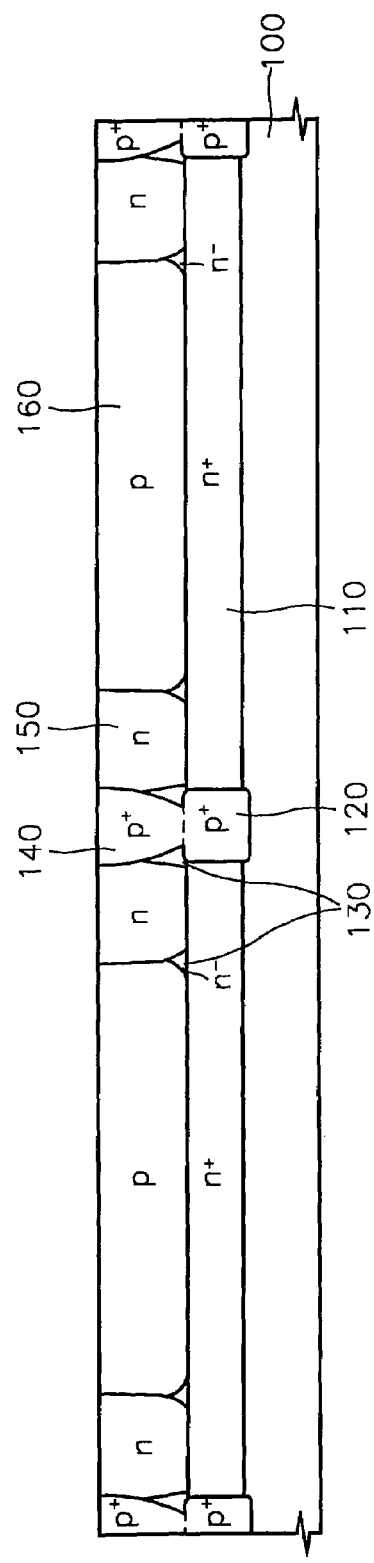

Referring now to FIG. 3B, in a further stage of processing, a mask pattern (not shown) may be formed to expose a part of the N⁻ epitaxial layer 130 corresponding to the P⁺ underlayer 120. Thus, P⁺ dopants may be implanted on the exposed part of the semiconductor substrate 100 to form a conductive well, following which operation the mask pattern may be removed. This completes a third stage in the processing.

Referring again to FIG. 3B, a mask pattern (not shown) may be formed to expose a nascent N-well region on the surface of the N⁻ epitaxial layer 130. The mask pattern may then be removed after implanting the N⁻ dopants on the exposed nascent N-well region.

Next, after a further mask pattern (not shown) is formed to expose a nascent N⁺ epitaxial layer 130 and, preferably, a nascent P-well region and P⁻ dopants may be implanted therein. The mask pattern for forming a P-well may then be removed.

Next, as shown in FIG. 3B, a P⁺ isolation region 140, an N-well 150 and a P-well 160 may be formed by performing a drive-in process on the resultant structure. Thus, in the example discussed, first and second conductive wells and a conductive drift region may have been formed.

The exact process sequencing is not critical, for example, it is possible to change the order of the ion implantation processes for forming the P⁺ isolation region 140, the N-well 150, and the P-well 160 described above. Moreover, the P⁺ isolation region 140 may formed in contact with the P⁺ underlayer 120.

Conversely, it is possible for the N-well 150 and the P-well 160 to contact (refer to FIG. 3B) or to be implanted so that the N-well 150 and the P-well 160 contact each other. Alternatively they may be separated a specific distance from the surface of the N⁺ buried layer 110, as shown in FIG. 2, according to a desired or specified breakdown voltage criterion.

Figure 3C:
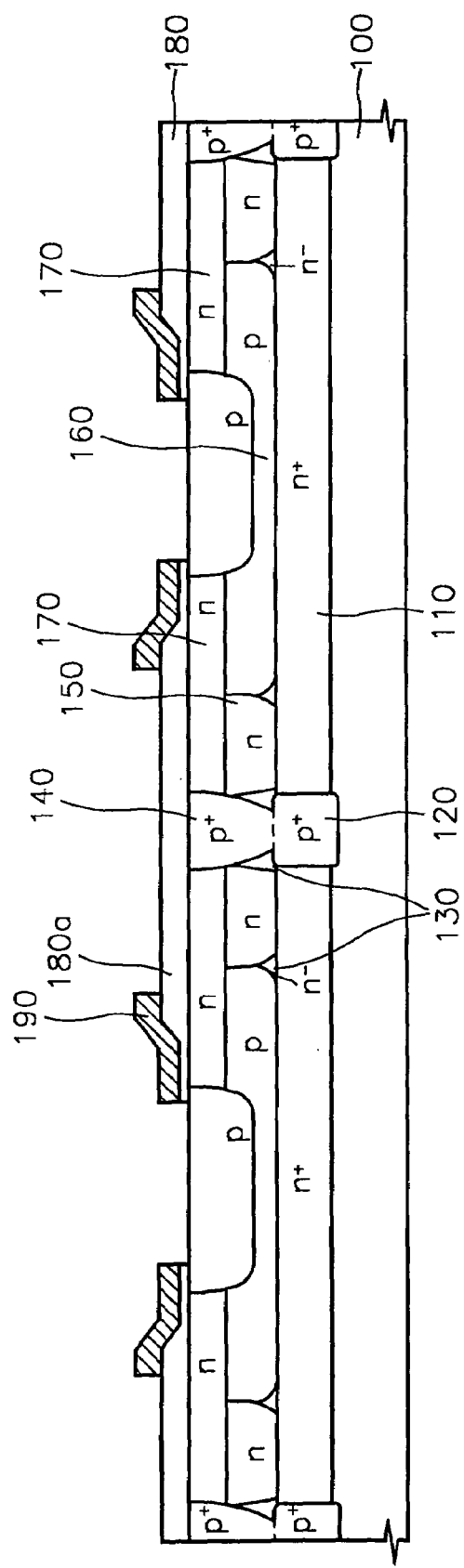

Referring now to FIG. 3C, a mask pattern (not shown) for a drift region may be formed on the resultant structure of the semiconductor substrate 100 to expose particular portions of the N-well 150 and the P-well 160. Next, N⁻ dopants for forming a nascent N-drift region may be implanted on the exposed N-well 150 and the P-well 160. The nascent N-drift region will become fully formed N-drift region 170 after a drive-in procedure (see below). The N⁻ dopants are typically channel stop ions implanted at the lower portion of a field oxide layer concurrent with manufacture of CMOS devices on the shared substrate. In this case, N⁻ dopants that are the channel stop ions may have low concentrations. The ion implantation process of the N⁻ dopants may be performed at the same time as the channel stop ion implantation process of the CMOS devices is performed. Subsequently, the mask pattern may be removed.

Thus, the process for forming the N-drift region is accomplished without adding further process stages.

Still referring to FIG. 3C, in further processing a mask pattern (not shown) for defining the active region may be formed to expose the P⁺ isolation region 140 and predetermined portions of the N-well 150, and the P-well 160. In this case, the mask pattern for defining the active region may be, for example, a Silicon Nitride layer pattern.

Still referring to FIG. 3C, a thick-film gate oxide layer 180a may next be formed by partially oxidizing the exposed P⁺ isolation region 140, the N-well 150 and the P-well 160. For example, the thick-film gate oxide layer 180a may be formed using a general LOCOS oxidation procedure. If the mask pattern used for defining the active region is a Silicon Nitride layer then it may be eliminated using, for example, Phosphoric acid solution.

Next, a thin-film gate oxide layer (See FIG. 2, reference 180b) may be formed at one or more sides of the thick-film gate oxide layer 180a by oxidizing the resultant structure. The thin-film gate oxide layer 180b may be patterned to expose a predetermined portion of the thin-film gate oxide layer 180b, for example, for a nascent source region for the high power LDMOS (See FIG. 3D, reference 220).

Referring again to FIG. 3C, a polycrystalline Silicon layer for a gate may be deposited on the resultant structure. Then, a gate 190 may be formed by implanting dopants in the polycrystalline silicon layer and patterning the doped polycrystalline silicon layer for improved conductivity.

P-dopants for a nascent P-body region may be implanted into exposed areas masked off by gate oxide layers 180a, 180b and gate 190. The nascent P-body region will become fully formed P-body region 200 after a drive-in procedure. The dopants for such a P-body region may typically be of low concentration. N-drift region 170 and P-body region 200 may then be formed by performing a drive-in process.

It may be preferable to implant P⁻ dopant with an appropriate combination of concentration and drive-in energy so that the bottom of the P-body region 200 falls entirely within the P-well 160 to form the P-body region 200. Since the ON-resistance and breakdown characteristics of the LDMOS of the present invention are controlled by the properties of the N-drift region 170, it may be important to carefully control the thickness and the concentration of the N-drift region 170. Moreover, since the N-drift region 170 may be formed, for example, by ion implantation process, it is thus possible to accurately control both its thickness and doping concentration.

Figure 3D:
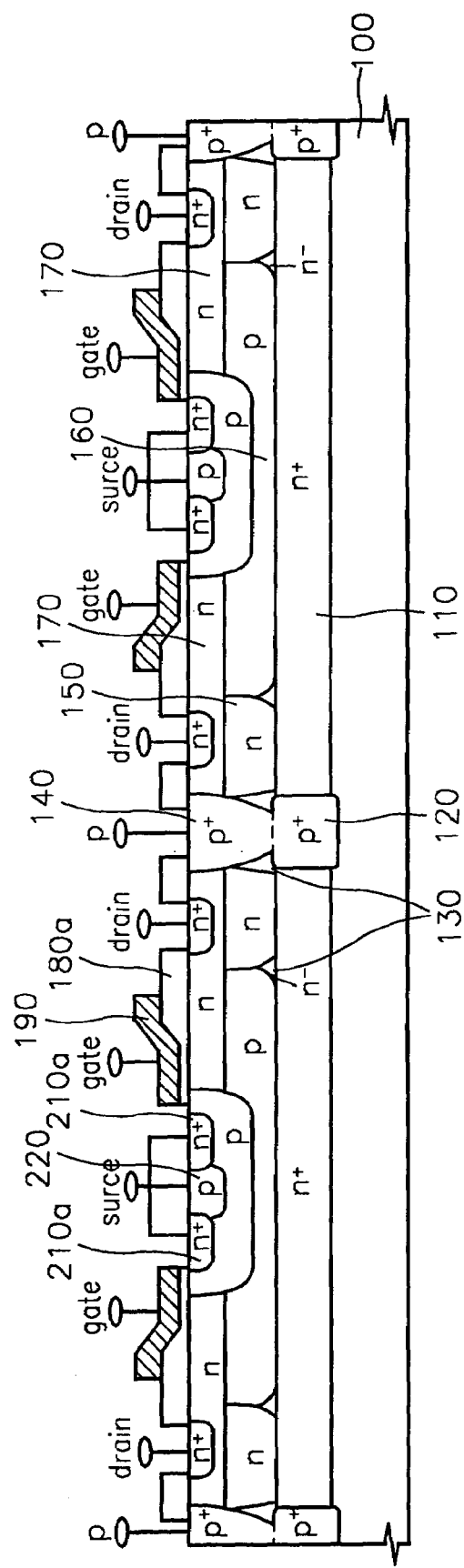

Referring now to FIG. 3D, a predetermined portion of the gate oxide layer such as the thick gate oxide layer 180a, may be patterned to expose a nascent drain region for forming a drain in the LDMOS. The nascent drain region can be formed at a side of the gate 190. The nascent drain region will become fully formed drain region, for example, 210b after a drive-in procedure. Thus, the exposed body region 200 and the preliminary drain region may be implanted with N⁺ dopants, activated, and formed into the source and drain regions 210a and 210b.

Then a mask pattern (not shown) may be formed to expose a preliminary drain region 210a, the exposed source region 210a may be implanted with P⁺ dopants, activated, and so formed into the P-contact region 220.

Finally, a gate 190 may be connected to the gate electrode (G), the source region (S) 210 and the P⁺ source contact region 220 may be connected to a source electrode (S), and the drain region 210b may be connected to the drain electrode (D). A P⁺ isolation region 140 may be used to be supplied with isolation power (P).

The LDMOS having a structure as described above may be operated as follows. An inverse bias may be applied to the drain region 210b from a drain electrode (D), and a depletion region will occur. This depletion region may extend from the P-N junction interface of the P-well 160 and the N-drift region 170, the P-N junction interface of the P-well 160 and the N-epitaxial layer 130 or from where the P-N junction interface of the P-well 160 contacts the N⁺ buried layer 110. This latter case applies if the P-well 160 contacts the N⁺ buried layer 110 as may, but need not, be the case.

As described above, an LDMOS embodied according to the present invention is designed so that a breakdown firstly occurs at the P-N junction interface of the P-well 160 and the N-epitaxial layer 130. Or, alternatively at the P-N junction interface between the P-well 160 and the N⁺ buried layer 110 (if the p-well 160 contacts the N⁺ buried layer 110). Thus, breakdown is substantially independent of the concentration of the N-type drift region 170.

Consequently the concentration of the N-drift region 170 can be increased to provide selected ON-resistance characteristics and thus, ON-resistance characteristics may be improved over previously developed solutions. In addition, breakdown of an LDMOS embodied according to the present invention may be confined to deep inside the substrate. Thus, the time for extending a depletion region to its maximum may be delayed, and the breakdown voltage can be increased.

Since the breakdown voltage of the LDMOS is primarily controlled by the distance between the P-well 160 and the N⁻ epitaxial layer 130, it may be necessary to carefully control the depths of the P-well 160 and the N-drift region 170. But there is no need to control the thickness of the entire N⁻ epitaxial layer 130. As described above, the P-well 150 and the N-type drift region 170 may be formed using the ion implantation process, so it is easy to control their thickness.

In addition, there is no electric barrier between the source region 210a and the drain region 210b, and the channel path is short. Thus, it is possible to further increase on resistance characteristics.

The present invention is not limited to the above, preferred, embodiment. For example, an N-channel LDMOS was described in the present embodiment, but the present invention may alternatively be embodied as a P-channel LDMOS.

As described above and according to the present invention, an N-epitaxial layer may be uniformly formed, and P-well and N-drift regions for controlling the breakdown voltage and the on-resistance may be formed using an ion implantation process. Accordingly, a breakdown voltage may be determined by the depths and doping concentrations of an N-drift region and a P-well irrespective of the thickness of the N⁻ epitaxial layer. Hence, a need for critical control of the thickness of the epitaxial layer is avoided, especially in cases wherein lots of devices are merged, such as in a BCD device.

Moreover, breakdown at the interface of the N-drift region is avoided, and it is possible to obtain low ON-resistance by controlling the concentrations at the interface of the N-drift region. Furthermore, the N-type drift region may be formed during a channel-stop ion implantation process of any co-present CMOS device. Therefore, any need for additional production processes may be avoided.

Figure 4B:
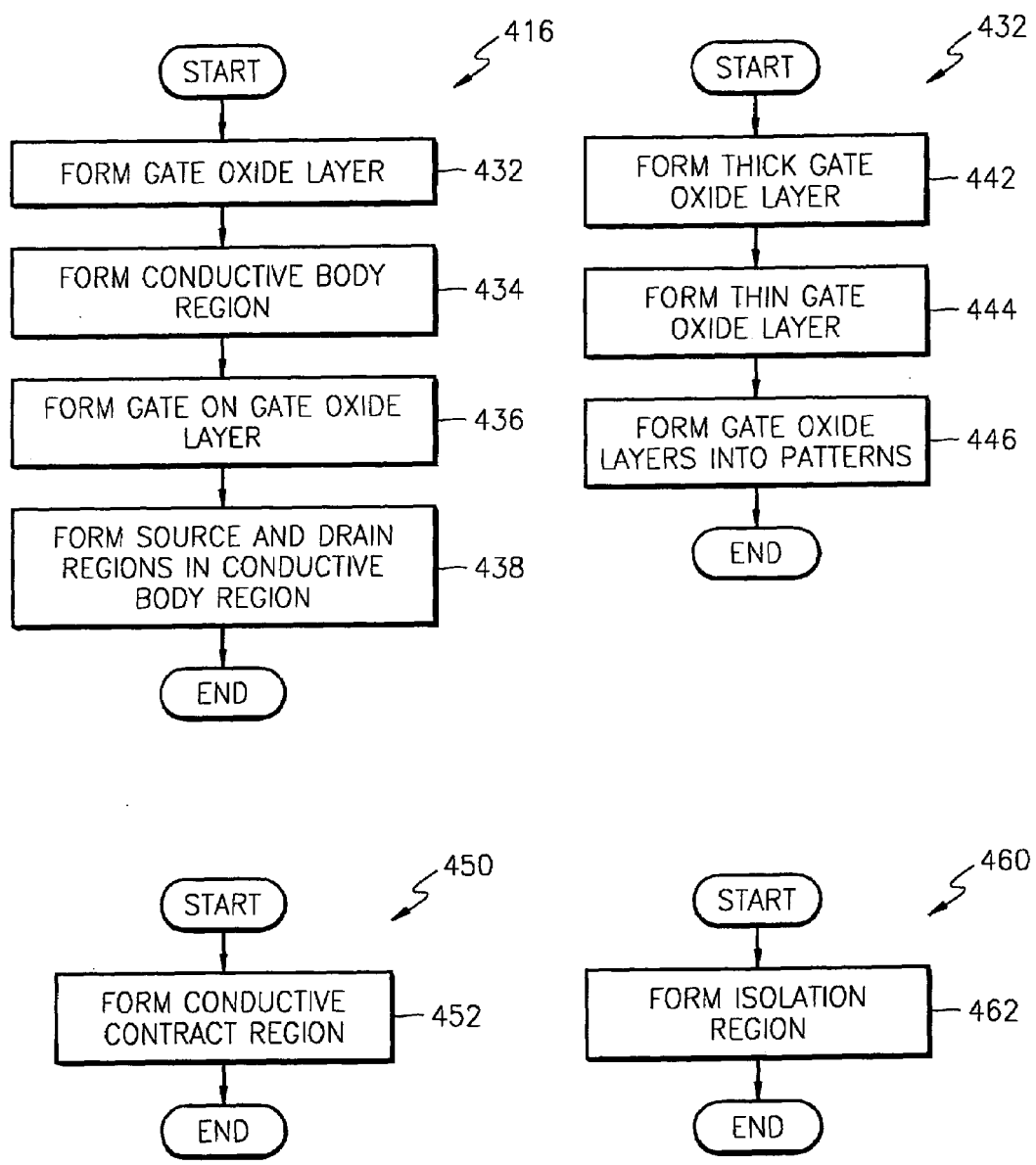
Figure 4C:
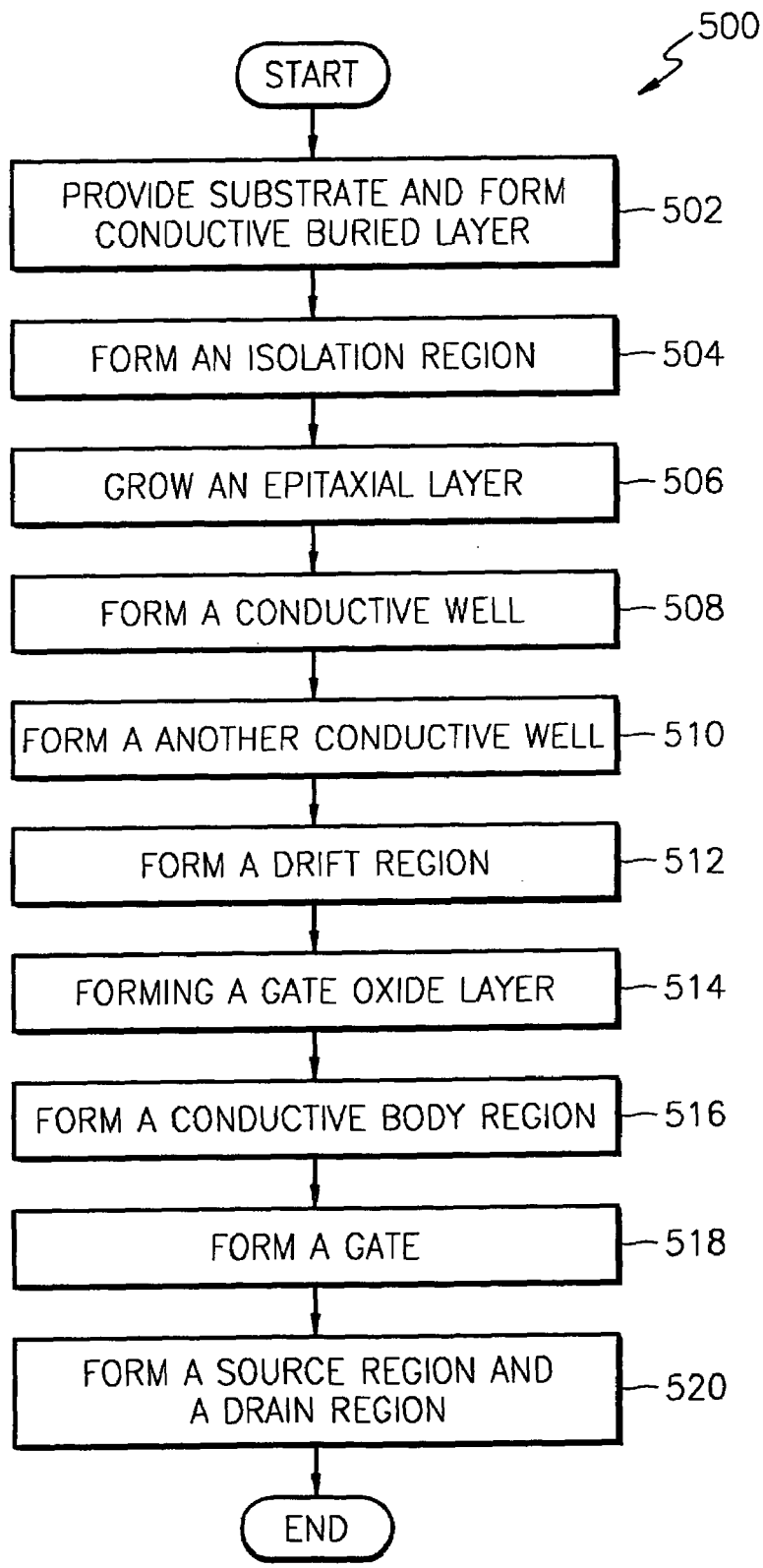

Referring now to FIGS. 4A–4C which are flow diagrams for methods for manufacturing semiconductor devices, according to embodiments of the present invention as described below.

FIG. 4A shows method 400 comprising: providing a semiconductor substrate 402; forming a conductive buried layer within the semiconductor substrate 404; epitaxially growing a conductive epitaxial layer on the buried layer 406; forming a conductive well in a predetermined region within the conductive epitaxial layer 408; forming another conductive well in the conductive epitaxial layer 410 to the side; forming a conductive drift region 412 in an upper region of the first and the second conductive wells and forming a lateral double diffused MOS transistor in the conductive drift region 414.

FIG. 4A also shows method 420 as a possible method for forming conductive wells or conductive drift regions in which: act 420 is ion implantation of a conductive dopant and step 422 is activation such as by drive in cycle.

FIG. 4B shows a possible method 416 for forming an LDMOS transistor comprising: 432 forming a gate oxide layer in a predetermined region on the semiconductor substrate; 434 forming a conductive body region within the semiconductor substrate to a side of the gate oxide layer; 436 forming a gate on the gate oxide layer; and 438 forming a source region in the conductive body region, and a drain region in the conductive drift region.

FIG. 4B also shows a possible method 432 for forming the gate oxide layer, comprising: 442 forming a thick gate oxide layer by partially oxidizing a predetermined region of the semiconductor substrate, 444 forming a thin gate oxide layer adjoining at least two sides of the thick gate oxide layer, and 446 forming the thick and the thin gate oxide layers into predetermined patterns.

Still referring to FIG. 4B, method 450 may be used as a additional act in other methods and comprises 452 forming a conductive contact region having high doping concentration within the source region after the act of forming the source and the drain regions has been completed.

Still referring to FIG. 4B, method 460 may be used as an additional act in other methods and comprises 462 forming an isolation region within the semiconductor substrate after forming the conductive epitaxial layer and before forming the second conductive well.

Referring now to FIG. 4C, another method 500 is shown in which is shown: 502 providing a semiconductor substrate and forming a conductive buried layer within the substrate; 504 forming an isolation region to at least two sides of the buried layer; 506 growing a second epitaxial layer on the resultant of substrate; 508 forming a second conductive well in a predetermined region within the epitaxial layer; 510 forming a first conductive well within the epitaxial layer between the beside the second conductive well by implanting first conductive dopants; 512 forming a drift region in a region on the first and the second conductive wells by implanting second conductive dopants; 514 forming a gate oxide layer with a substantially non-uniform thickness in a predetermined region of the semiconductor substrate; 516 forming a conductive body region within the semiconductor substrate to a side of the gate oxide layer; 518 forming a gate on the gate oxide layer; and 520 forming a source region in the conductive body region and a drain region in the conductive drift region to at least two sides of the gate and the gate oxide layer.

While the present invention has been particularly shown and described with reference to a preferred embodiment thereof, it will be understood by those skilled in the art that various changes in form and details may be made therein without departing from the spirit and the scope of the invention.

What is claimed is:

1. A power device comprising:
    a semiconductor substrate;
    a conductive buried layer formed within the semiconductor substrate;
    a conductive epitaxial layer formed on the conductive buried layer;
    a first conductive well formed within the conductive epitaxial layer;
    a second conductive well formed within the conductive epitaxial layer, on at least two sides of the first conductive well;
    a conductive drift region formed in predetermined portions on the first and the second conductive wells;

a lateral double diffused MOS transistor having a source region and a drain region formed in the conductive drift region; and a conductive body region formed between the first conductive well and the source region;

wherein the conductive drift region lies between the second conductive well and the drain region.

2. The power device of claim 1, wherein
the first conductive well and the conductive buried layer are embodied with a mutual distance predetermined responsive to a specified breakdown voltage criterion.

3. The power device of claim 1, wherein the lateral double diffused MOS transistor comprises:

a gate insulating layer formed in a predetermined portion on the conductive drift region; and a gate formed on the gate insulating layer;

wherein the conductive body region is formed in the conductive drift region to a side of the gate, the source region is formed within the conductive body region, and the drain region is formed in the conductive drift region.

4. The power device of claim 3, wherein the gate insulating layer comprises a thick oxide layer and a thin oxide layer connected to a side of the thick oxide layer.

5. The power device of claim 3, wherein the source region further comprises a conductive high-concentration source contact region.

6. The power device of claim 3, further comprising a conductive junction region located in the source region having a high doping concentration.

7. The power device of claim 1, further comprising an isolation region formed outside the second conductive well.

8. The power device of claim 7, wherein the isolation region comprises an isolation conductive region comprising high-concentration dopant formed at a surface of the semiconductor substrate through the conductive buried layer.

9. The power device of claim 1, wherein the first conductive well is P type and the second conductive well is N type.

* * * * *